(12) United States Patent
Kashyap et al.

(10) Patent No.: US 9,727,261 B2
(45) Date of Patent: Aug. 8, 2017

(54) WEIGHTED PROGRAMMING PATTERNS IN SOLID-STATE DATA STORAGE SYSTEMS

(71) Applicant: Western Digital Technologies, Inc., Irvine, CA (US)

(72) Inventors: Abhilash Ravi Kashyap, San Jose, CA (US); Dale Charles Main, La Canada-Flintridge, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 101 days.

(21) Appl. No.: 14/864,653

(22) Filed: Sep. 24, 2015

(65) Prior Publication Data

US 2017/0090785 A1 Mar. 30, 2017

(51) Int. Cl.
*G06F 12/02* (2006.01)
*G06F 3/06* (2006.01)
*G11C 11/56* (2006.01)
*G11C 16/34* (2006.01)

(52) U.S. Cl.
CPC .......... *G06F 3/0619* (2013.01); *G06F 3/0632* (2013.01); *G06F 3/0679* (2013.01); *G11C 11/5628* (2013.01); *G11C 11/5642* (2013.01); *G11C 16/3427* (2013.01)

(58) Field of Classification Search
None
See application file for complete search history.

(56) References Cited

U.S. PATENT DOCUMENTS

| | | |
|---|---|---|
| 5,835,413 A | 11/1998 | Hurter et al. |
| 6,856,556 B1 | 2/2005 | Hajeck |
| 7,079,421 B2 | 7/2006 | Yaoi et al. |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,525,838 B2 | 4/2009 | Jung et al. |

(Continued)

OTHER PUBLICATIONS

International Search Report dated Jan. 10, 2017 for PCT/US2016/05298.

(Continued)

*Primary Examiner* — Duc Doan
(74) *Attorney, Agent, or Firm* — Chang & Hale LLP

(57) ABSTRACT

Systems and methods are disclosed for programming data in non-volatile memory arrays. A data storage device includes a solid-state non-volatile memory including a plurality of memory cells and a controller configured to improve data retention or reduce read disturb of at least a portion of the solid-state non-volatile memory at least in part by receiving data to be written to the solid-state non-volatile memory. The controller is further configured to, when a data retention programming mode is set, encode the data using a programming pattern that favors a first programming state over a second programming state, the first programming state being associated with a lower voltage level than the second programming state, and write the encoded data to the solid-state non-volatile memory. When a read disturb programming mode is set, the first programming state is associated with a higher voltage level than the second programming state.

26 Claims, 11 Drawing Sheets

(56) References Cited

U.S. PATENT DOCUMENTS

| | | |
|---|---|---|
| 7,596,643 B2 | 9/2009 | Merry, Jr. et al. |
| 7,644,225 B2 | 1/2010 | Dover |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 8,078,918 B2 | 12/2011 | Diggs et al. |
| 8,090,899 B1 | 1/2012 | Syu |
| 8,095,851 B2 | 1/2012 | Diggs et al. |
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,171,386 B2 | 5/2012 | Chandra et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 8,938,655 B2 | 1/2015 | Hamilton et al. |
| 8,984,369 B2 | 3/2015 | Varanasi |
| 2010/0174849 A1 | 7/2010 | Walston et al. |
| 2010/0250793 A1 | 9/2010 | Syu |
| 2011/0099323 A1 | 4/2011 | Syu |
| 2011/0283049 A1 | 11/2011 | Kang et al. |
| 2012/0260020 A1 | 10/2012 | Suryabudi et al. |
| 2012/0278531 A1 | 11/2012 | Horn |
| 2012/0284460 A1 | 11/2012 | Guda |
| 2012/0324191 A1 | 12/2012 | Strange et al. |
| 2012/0324314 A1 | 12/2012 | Seshadri et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0143631 A1* | 5/2014 | Varanasi .............. G11C 7/1006 714/763 |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |
| 2014/0281768 A1 | 9/2014 | Hung et al. |

OTHER PUBLICATIONS

Written Opinion Report dated Jan. 10, 2017 for PCT/US2016/052928.

* cited by examiner

WEIGHTED PROGRAMMING PATTERNS IN SOLID-STATE DATA STORAGE SYSTEMS

BACKGROUND

Field

This disclosure relates to data storage systems. More particularly, the disclosure relates to systems and methods for encoding data in solid-state memory devices.

Description of Related Art

Certain solid-state memory devices, such as solid-state drives (SSDs), flash drives, or the like, store information in an array of memory cells constructed with floating gate transistors. Endurance and data integrity of solid-state memory cells can be affected by various factors. How data is encoded can have an effect on whether programmed data can be successfully interpreted when read at a later time.

BRIEF DESCRIPTION OF THE DRAWINGS

Various embodiments are depicted in the accompanying drawings for illustrative purposes, and should in no way be interpreted as limiting the scope of this disclosure. In addition, various features of different disclosed embodiments can be combined to form additional embodiments, which are part of this disclosure.

DETAILED DESCRIPTION

Figure 1A:
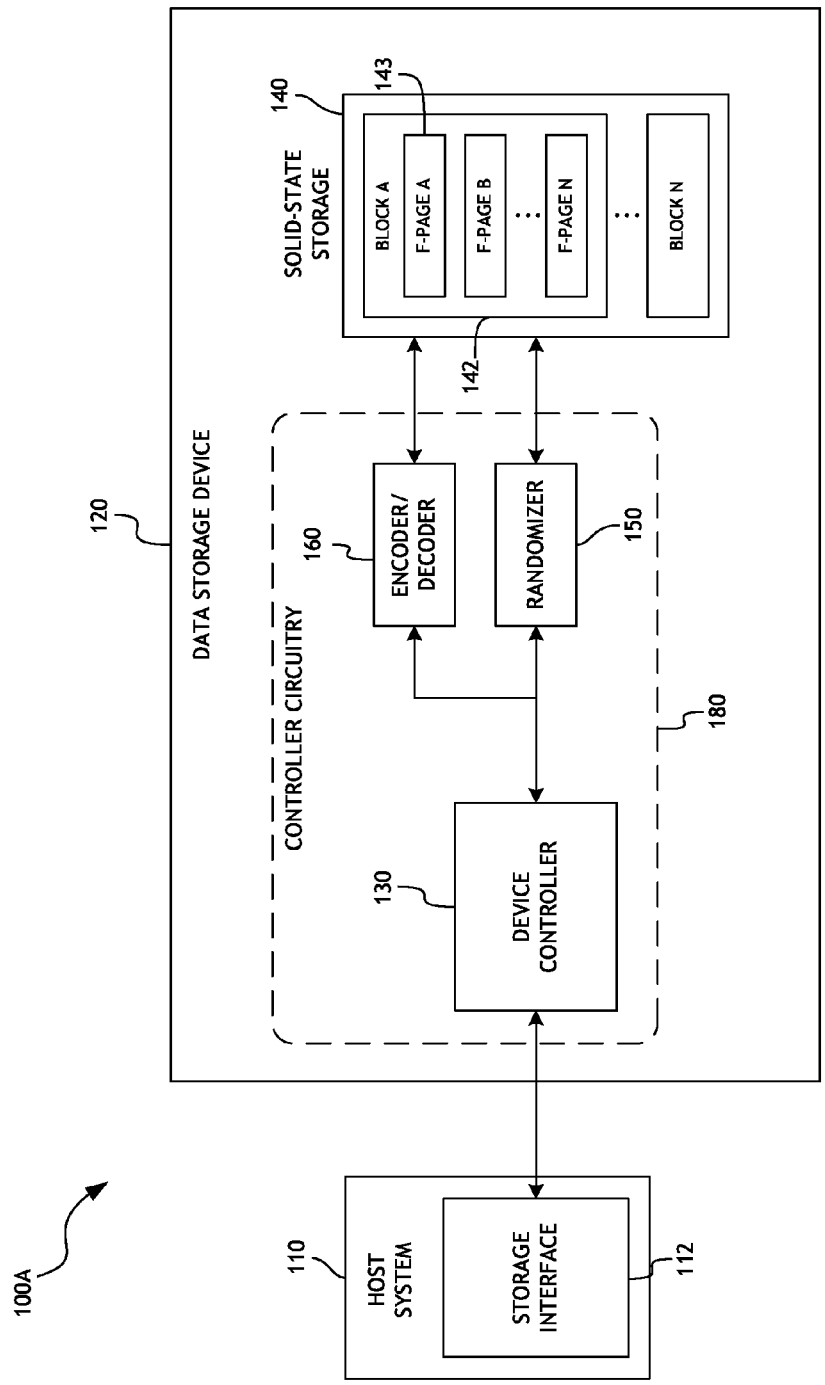
FIGS. 1A and 1B are block diagrams representing embodiments of a data storage device according to one or more embodiments.

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection.

The headings provided herein are for convenience only and do not necessarily affect the scope or meaning of the claims. Disclosed herein are example configurations and embodiments relating to weighted pattern programming in solid-state memory to compensate for data retention and/or read disturb issues.

As used in this application, "non-volatile solid-state memory," "non-volatile memory," "NVM," or variations thereof may refer to solid-state memory such as NAND flash. However, the systems and methods of this disclosure may also be useful in hybrid drives including both solid-state and hard drive components. Solid-state memory may comprise a wide variety of technologies, such as flash integrated circuits, Phase Change Memory (PC-RAM or PRAM), Programmable Metallization Cell RAM (PMC-RAM or PMCm), Ovonic Unified Memory (OUM), Resistance RAM (RRAM), NAND memory, NOR memory, EEPROM, Ferroelectric Memory (FeRAM), MRAM, or other discrete NVM (non-volatile solid-state memory) chips. The non-volatile solid-state memory arrays or storage devices may be physically divided into planes, blocks, pages, and sectors, as is known in the art. Other forms of storage (e.g., battery backed-up volatile DRAM or SRAM devices, magnetic disk drives, etc.) may additionally or alternatively be used.

Overview

The present disclosure provides systems and methods for encoding data for programming in solid-state memory devices. Although certain embodiments are disclosed herein in the context of NAND flash memory devices/systems, it should be understood that the principles disclosed herein may be applicable in connection with any type of solid-state memory.

NAND flash memories, and other non-volatile solid-state memory devices, are widely used in solid-state storage devices. In certain solid-state memory devices/systems, the ability to correctly decode data written to solid-state memory cells may be adversely affected by retention related and/or read disturb effects. For example, in prolonged storage applications, lack of data retention can lead to decoding failure. Furthermore, in relatively high-read utilization use cases, read disturb may lead to decoding failures. "Data retention," as used herein, may be understood according to its broad and ordinary meaning and may refer to the ability to recover data programmed in solid-state memory after a period of time. "Data retention period" may be used to refer to the period of time itself over which data may be stored in solid-state memory. "Retention related effects" may be used to refer to the loss or migration of charge in a programmed cell due to the passing of time, temperature, and/or other factors.

Endurance and/or data retention may represent significant specification metrics for certain solid-state memory products. Solid-state storage devices generally have limited endurance, which may be characterized by a number of terabytes (TB) per year of write data, which may be specified as a warranty condition by the device manufacturer. Because endurance and data retention may generally be considered to have a substantially inverse relationship, heavily-cycled blocks may have relatively shorter retention compared to similar lightly-cycled blocks. As a solid-state memory device is cycled, it may lose its data retention capabilities, thereby resulting in data loss. Various mechanisms may be implemented to improve data retention characteristics. For example, reducing program/erase (P/E) cycles on blocks, increasing relaxation periods between cycles, as well as other mechanisms. However, implementation of such mechanisms may result in lower device performance.

Generally, read disturb errors may be due at least in part to charge gain, wherein charge is added to cells during a read of neighboring cell(s), thereby causing the cell charge level to migrate from one voltage level/state to the next higher voltage state. The cells with the lowest voltage level(s) may tend to gain charge faster than cells at higher voltage levels due at least in part to the relatively lower voltage across the dielectric of the cells. Because of this, cells in the lowest voltage state (e.g., an 'erase,' or 'E,' state) may be impacted the most by read disturb.

Certain embodiments disclosed herein provide for the patterning of data to be programmed to non-volatile solid-state memory to favor one or more programming voltage levels/states over one or more other levels/states in certain modes of operations. According to some embodiments, disclosed herein are system and methods for utilizing programming patterns that favor relatively lower voltage threshold (Vt) encoded state(s). For example, the lower voltage favoring patterns may be used by a storage device or system to program the data into non-volatile solid-state memory on a last cycle before the data storage device enters a data retention mode of operation. By programming more cells of the solid-state memory to the lower voltage state(s), the charge loss stemming from retention related effects may be at least partially reduced, resulting in lower bit error rates. Such schemes may help improve the data retention characteristics of the data storage device, which may be traded off and used to achieve better endurance.

According to other embodiments, disclosed herein are programming schemes that favor relatively higher voltage threshold (Vt) encoded state(s), which may be used by the data storage system to program the data into the non-volatile solid-state memory. Higher voltage favoring schemes may be implemented, for example, on a final cycle before the data storage device enters a relatively high read utilization period. By programming more cells of the solid-state memory to the higher voltage threshold (Vt) state(s), the charge gain experienced by the cells due to the read disturb effect may be at least partially minimized, resulting possibly in lower bit error rates.

Data Storage System/Device

FIG. 1A is a block diagram illustrating an embodiment of a combination of a host system 110 with a data storage device 120 incorporating data retention improvement and/or read disturb compensation functionality in accordance with one or more embodiments disclosed herein. As shown, the data storage device 120 (e.g., hybrid hard drive, solid-state drive, any storage device utilizing solid-state memory, etc.) includes controller circuitry 180, which may include a device controller (e.g., interface controller) 130 configured to receive data commands and execute such commands in non-volatile solid-state storage 140 including solid-state memory cells. Such commands may include data read/write commands, and the like. The device controller 130 may be configured to receive data commands from a storage interface (e.g., a device driver) 112 residing on the host system 110. Data commands may specify a block address in the data storage device 120; data may be accessed and/or transferred based on such commands. In certain embodiments, the data storage device 120 may be a PCIe based card type storage device.

The data storage device 120 can store data received from the host system 110 such that the data storage device 120 acts as data storage for the host system 110. To facilitate this function, the controller 130 may implement a logical interface, wherein the logical interface can present to the host system memory as a set of logical addresses (e.g., sequential/contiguous addresses) where data can be stored. Internally, the controller 130 can map logical addresses to various physical memory addresses in the non-volatile solid-state storage 140 and/or other memory module(s). Mapping data indicating the mapping of logical addresses to physical memory addresses may be maintained in the data storage device 120. For example, mapping table data may be stored in non-volatile solid-state storage 140 in order to allow for re-creation of mapping tables following a power cycle.

The device controller 130 may include one or more memory modules (not shown), such as non-volatile memory (e.g., ROM) and/or volatile memory (e.g., RAM, such as DRAM). In certain embodiments, the device controller 130 may be configured to store information, including, for example, operating system(s) code, application code, system tables and/or other data, in the non-volatile solid-state storage 140 and/or other non-volatile memory such as a boot ROM not shown in the figure. On power-up, the device controller 130 may be configured to load such data for use in operation of the data storage device 120.

The controller circuitry 180 may receive memory access commands from the host system 110, including programming commands, and implement such programming commands in the non-volatile solid-state storage 140 according to a data programming scheme. In certain embodiments, the controller circuitry 180 is configured to implement a multi-level cell (MLC) programming scheme, which, as used herein, refers a scheme in which cells of solid-state memory are programmed to store a charge level representative of two or more bits of data (two bits per cell, three bits per cell, four bits per cell, etc.). Such a programming scheme is described in further detail below with reference to FIG. 2. Additionally or alternatively, the controller circuitry 180 may be configured to implement single-level cell (SLC) or other programming scheme. Although certain embodiments are disclosed herein in the context of teaching examples showing MLC programming schemes with two bits per cell, it should be understood that the inventive concepts disclosed herein may be applicable in any desirable or suitable programming scheme, including any number of bits per cell or programming states.

The controller circuitry may further include a randomizer module 150 and/or an encoder/decoder module 160. One or more of such modules may be components of the storage device controller 130, components of a controller associated with the solid-state storage 140 (e.g., NAND controller), or discrete components apart from those controllers. The randomizer 150 may be configured to scramble data to be written to the solid-state storage 140 in order to produce a substantially even distribution of programmed voltage states in the cells. For example, the randomizer 150 may execute an operation that, through randomization, evenly distributes the programmed states of the cells in the final recorded data patterns in the memory to prevent certain voltage state(s) from being overused. Since different voltage levels exact different levels of wear on the cells, data randomization may function to improve data reliability by evening distributing wear across the cells.

Errors in solid-state memory can be caused by a number of conditions. For example, read disturb may result when a memory cell is read repeatedly, causing charge to collect on the cell being read. Excessively high and/or low temperatures during programming may further lead to higher raw bit-error-rate (RBER) and/or degradation of memory endurance. In addition, retention related effects can lead to the gradual loss of charge on programmed cells, eventually resulting in one or more cells migrating across voltage state boundaries and causing decoding errors. Such charge loss may likewise be exacerbated by high temperature conditions.

Certain embodiments disclosed herein provide systems and methods for compensating for data retention and/or read disturb issues in solid-state memory devices. For example, disclosed herein are systems and methods for applying weighted patterns to programming data to at least partially reduce retention related effects and/or read disturb effects. Certain embodiments provide a lower-voltage states favoring programming scheme for enhancing data retention and endurance in solid-state memory, while certain other embodiments provide a higher-voltage states favoring programming scheme for enhancing read disturb margin in solid-state memory.

Figure 1B:
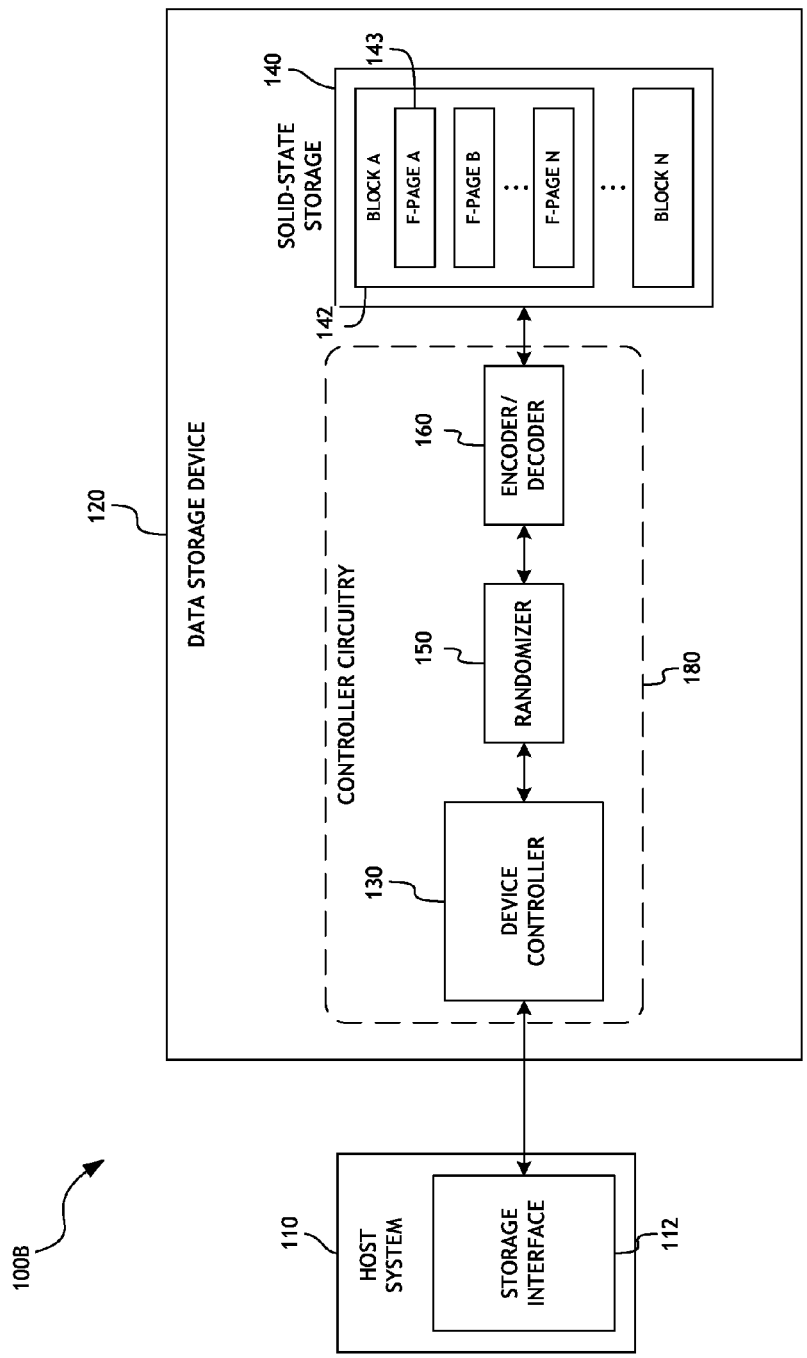

In certain embodiments, a data programming scheme is implemented to reduce, for example, MLC NAND flash raw bit error rate (RBER), and/or to improve data retention, and thereby indirectly improve endurance characteristics. Programming schemes disclosed herein may produce a data stream that is programmed to the solid-state memory directly without randomization or scrambling. For example, as shown in FIG. 1A, the programming scheme may be implemented using the encoder/decoder module 160, which may be disposed in the data path to be parallel with the randomizer 150, such that the randomizer 150 is effectively bypassed when implementing the weighted-pattern programming scheme. An alternative implementation is illustrated in FIG. 1B, where the encoder/decoder 160 is disposed in the data path in series with the randomizer 150 and downstream of the randomizer in the write path (or upstream of the de-randomizer in the read path), such that the data provided to the solid-state storage 140 is effectively patterned according to a weighted patterning scheme as described herein.

Figure 2:
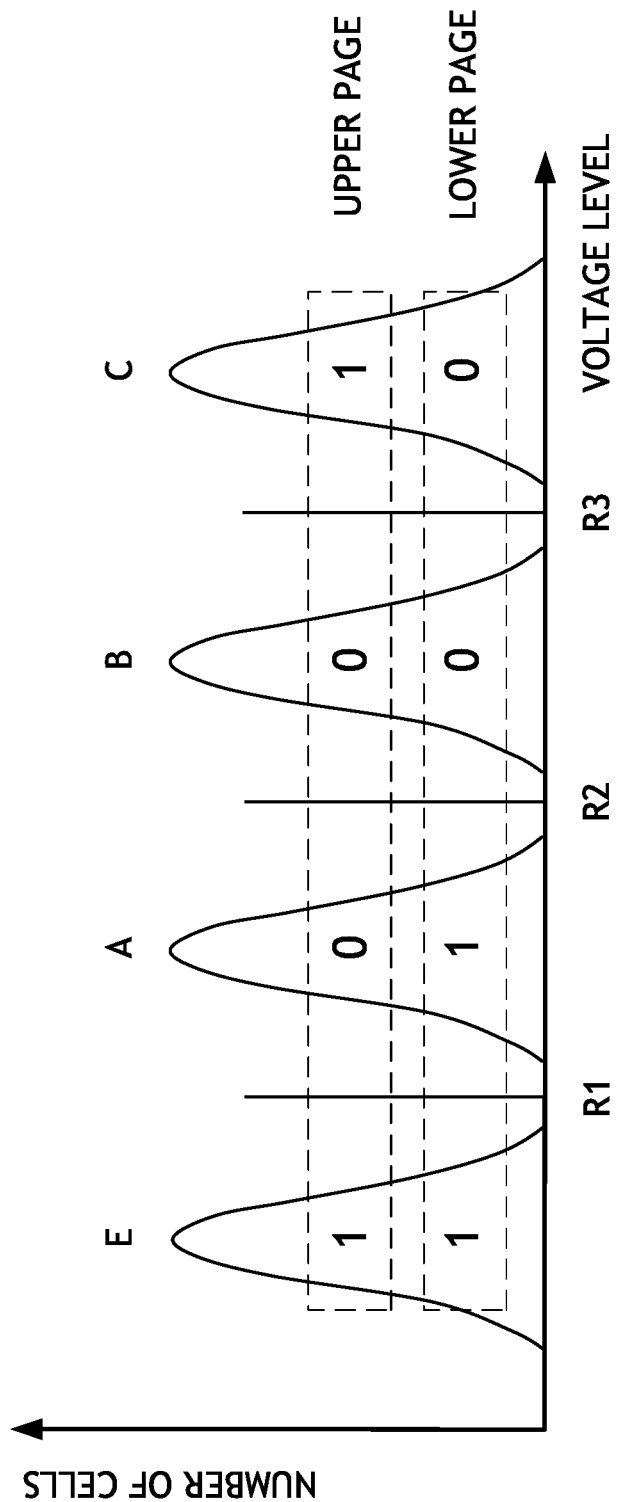
FIG. 2 is a graph showing a probability distribution of cells in a non-volatile memory array according to one or more embodiments.

FIG. 2 illustrates a graph showing a probability distribution of cells in a non-volatile memory array according to an embodiment. The distribution of FIG. 2 is associated with an example two bits per cell MLC programming scheme. While the simple two-bit scheme is used throughout for illustration, as stated above, the various embodiments of the invention can be generally applied to any MLC programming scheme, as well as an SLC one.

FIG. 2 shows four programming states: an erased state ('E'), and three programmed states ('A,' 'B,' 'C'), wherein each state represents one possible value for two bits of data. In certain embodiments, the programming states each comprise a most-significant bit, referred to herein as the "upper page," and a least-significant bit, referred to herein as the "lower page." While particular coding values are assigned to the various states of the distribution (e.g., '11' for 'E,' '01' for 'A,' '00' for 'B,' and '10' for 'C'), other coding schemes may also be used within the scope of the present disclosure.

In decoding memory cells, one or more reference voltage levels, referred to herein as "voltage read levels," may be used to read the cells to determine what charge state the cells are in. FIG. 2 illustrates three voltage read levels, R1, R2 and R3. In certain embodiments, lower page values may be determined based on a read at R2, while upper page values may be obtained by reading at R1 and/or R3.

In certain solid-state storage systems, data programmed to solid-state memory may be passed through a randomizer/scrambler module in order to generate a substantially-random programming pattern so that the cells are distributed substantially equally among each of the possible programming voltage states. For example, in an MLC scheme including four cell programmed states, as shown in FIG. 2, namely the 'E,' 'A,' 'B' and 'C' states, the cells may be distributed substantially equally among these states in order to provide for equal wear on the cells, to prevent program disturb (e.g., word line (WL)-to-WL disturbance and/or bit line (BL)-to-BL disturbance), as well as other negative effects, which may be caused by the programming of fixed, non-randomized patterns.

Data Retention Related Effects Compensation

Figure 3:
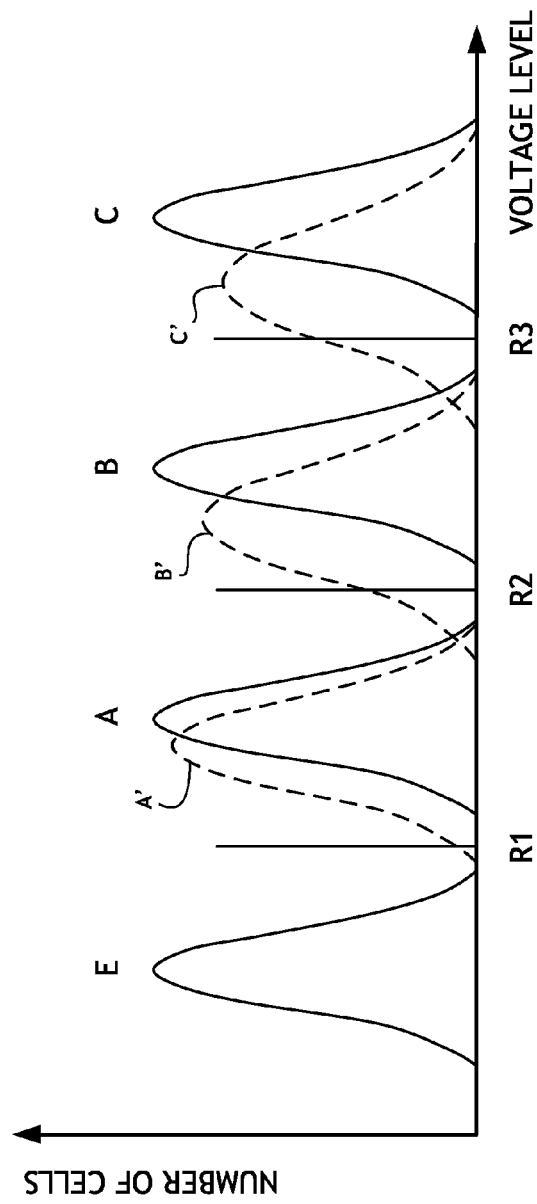
FIG. 3 is a graph showing a probability distribution of cells showing possible data retention related effects according to one or more embodiments.

Over time, charge loss and the like can cause the states of a voltage distribution to widen and/or shift and cross voltage read levels. FIG. 3 shows a shifted voltage distribution in dotted lines compared to the distribution of FIG. 2. Some of the programming states have crossed over adjacent read threshold(s), such as in response to charge loss during a data retention period, which can have a negative effect on the ability to correctly decode the programmed data. For example, as one voltage distribution widens towards another, the charge of a memory cell may cross the relevant read threshold, causing a bit to "flip" from '0' to '1,' or vice versa. The widened distributions (A', B', C') in FIG. 3 show the potential impact of retention related effects on the voltage state distributions. As shown, in certain embodiments, a highest voltage state (C) may experience the greatest migration of cells to the left towards the lower voltage states during a data retention period. Over time, the retention related effects may worsen, particularly with respect to devices that have experienced a high number of P/E cycles.

As is demonstrated in FIG. 3, in an example two-bit MLC programming scheme, the C-to-B state transition may represent the most prevalent bit-flip error caused by retention related effects. This may be due at least in part to the relatively higher voltage present on such cells, wherein the electric charges may be more inclined to escape the dielectric tunnel that traps them, causing charge loss. By avoiding placing an equal number of cells in the higher/highest voltage state(s) (e.g., states 'C,' 'B') as compared to lower/lowest voltage state(s), it may be possible to at least partially reduce bit-flip errors from state transitions C-to-B. In certain embodiments, C-to-B transition errors may constitute a majority or plurality of bit-flip errors with respect to retention related effects, followed possibly by B-to-A errors.

Figure 4:
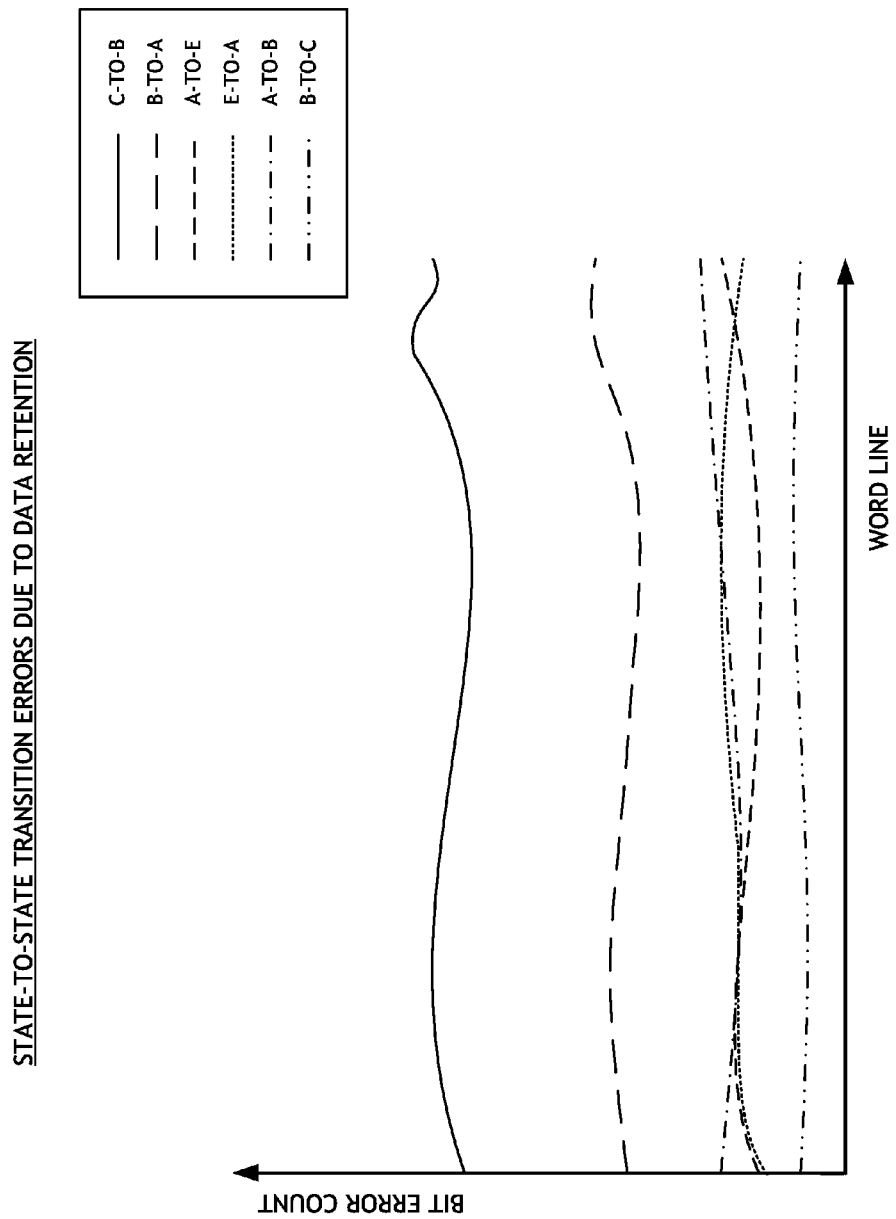
FIG. 4 is a graph showing state-to-state transition errors in a solid-state memory device according to one or more embodiments.

FIG. 4 is a graph showing state-to-state transition errors in a solid-state memory device according to one or more embodiments. The graph of FIG. 4 shows a relative sum of bit-flip errors for the various state-to-state transitions across an embodiment of a data storage device. FIG. 4 shows that, in certain embodiments, a substantial portion of bit-flip errors may be caused by C-to-B state transitions, and further by B-to-A transitions (see, e.g., FIG. 3). As shown in FIG. 3, in certain embodiments, the 'C' state distribution moves the most to the left and also widens the most to the left among the voltage states during a data retention period.

Thus, certain embodiments disclosed herein provide for data patterning to at least partially reduce the number of cells programmed to the 'C' state, and possibly to a lesser extent to the 'B' state, in this two bits per cell MLC example. In certain embodiments, such a pattern may be imposed on a data stream with the data randomizer/scrambler turned off or bypassed, or/and its output post-processed, to prevent evening out of data states across the 'C' and 'B' states that would normally be performed by the randomizer/scrambler. The pattern may utilize a weighted algorithm, for example. The weighted algorithm may favor one or more lower voltage states. For example, the lower/lowest voltage state(s) may be favored over the higher/highest voltage states.

In certain embodiments, with respect to an example two bits per cell MLC distribution as shown in FIGS. 2 and 3, the 'E' state may be favored over the 'C' state. In certain embodiments, each of the voltage states is progressively more favored from the highest state to the lowest state. For example, the 'E' state may be favored to the greatest degree, while the 'A' state is favored to a lesser extent with respect to the 'E' state but to a greater extent with respect to the 'B' and 'C' states, while the 'C' state is the least favored and the 'B' state is the second least favored. In certain embodiments, one state or subset of states is equally favored, while another state or subset of states is disfavored. For example, the 'E' state or 'E' and 'B' states may be disfavored, while the remaining states may be equally favored. The table below provides some simple distribution examples.

|   | Randomizer On | States Favored/ Disfavored Differently | Subset Example 1 | Subset Example 2 |
|---|---|---|---|---|
| E | 25% | 45% | 30% | 35% |
| A | 25% | 25% | 30% | 35% |
| B | 25% | 15% | 30% | 10% |
| C | 25% | 5% | 10% | 10% |

It can also be seen from the example representation of FIG. 4 that the transition from the lower Vt states (e.g., A-to-E, E-to-A) caused by retention related effects may be relatively low, and thus programming more cells into the lower voltage state(s) may result in longer data retention period without substantial data loss from uncorrectable errors.

In certain embodiments, the lower voltage state favoring pattern may advantageously only be applied when a relatively long data retention period is anticipated since the uneven programming may cause the cells to wear unequally and/or increase program disturb if used consistently. Various mechanisms may be used to trigger the use of the low voltage state programming scheme, some of which are described below in greater detail in connection with various flow diagrams presented with the present disclosure.

In certain embodiments, a command to enable and/or disable the use of the weighted programming scheme may be implemented as part of a host interface command protocol associated with the solid-state memory device (e.g., NAND flash). For example, when the host is aware that prolonged data retention period is likely with respect to certain data, the host may trigger, in the data storage device, the sequence to program the data using the weighted programming scheme (e.g., low voltage programming).

In certain embodiments, when a solid-state storage device exceeds a threshold number of writes, the device could be triggered to begin writing with the weighted programming scheme to protect against data losses due to retention related and/or read disturb effects. For example, the endurance specification of the device may dictate a maximum number of writes per year; the trigger threshold for the device may be based on this number. In certain embodiments, a number of available blocks in a free pool from which needed block are provisioned may also serve as a basis for triggering weighted pattern programming. For example, when the free pool is empty, the solid-state storage device could begin using the weighted pattern (e.g., low voltage state favoring or high voltage state favoring, as described in greater detail below).

In certain embodiments, the use of the programming scheme which favors lower voltage threshold encoded states may be used by the data storage device to program data into non-volatile solid-state memory on the last cycle before the memory enters a long data retention period when data is not expected to be overwritten, or in connection with graceful power-down of the memory. The storage device (e.g., device firmware) may detect the last P/E cycle and on the last program operation for each page and program the data to the solid-state memory using the weighted programming scheme. Furthermore, implementation of the weighted programming scheme may further be based on a data type.

Figure 5:
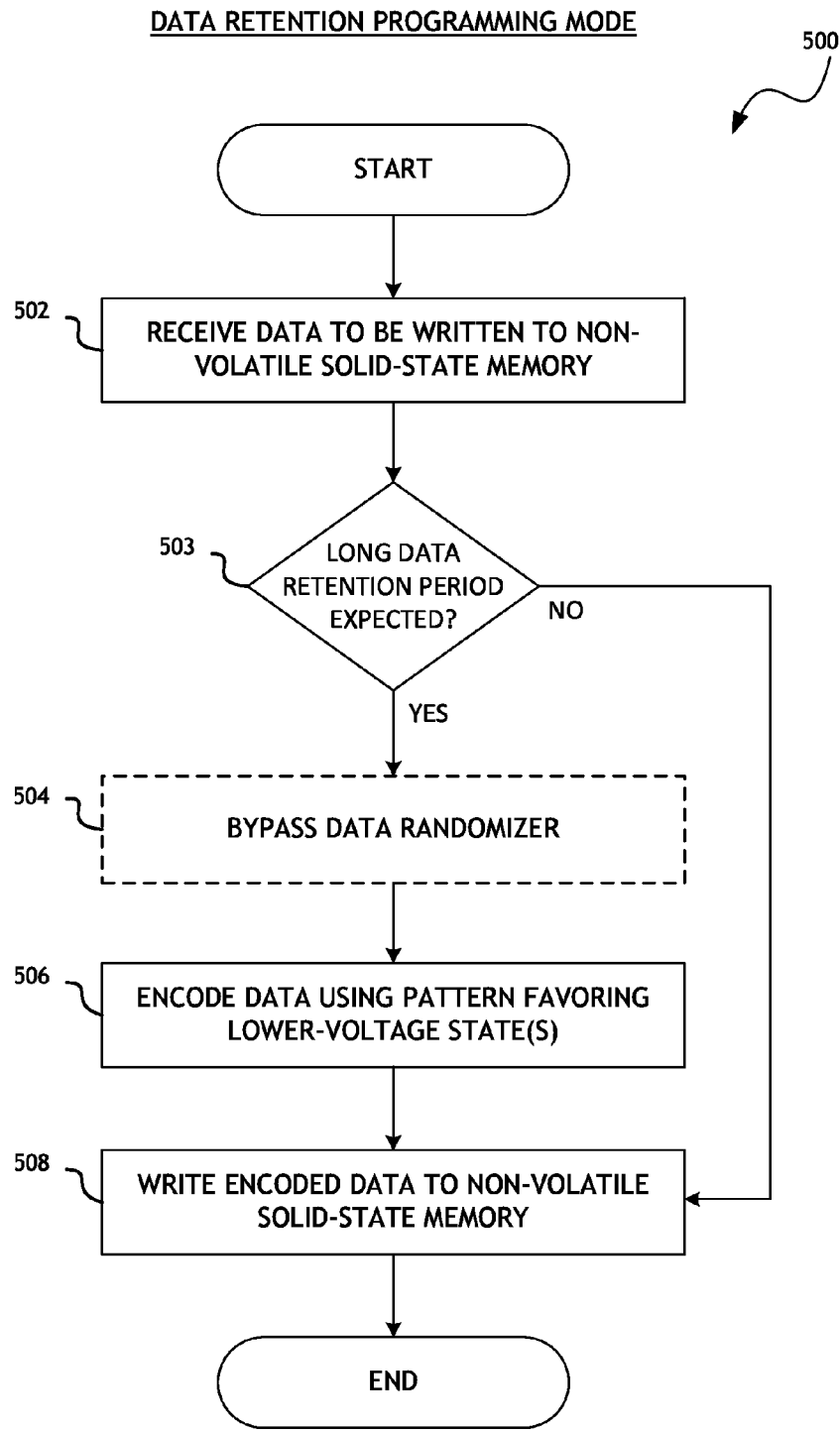
FIG. 5 is a flow diagram illustrating a data retention programming mode according to one or more embodiments.

FIG. 5 is a flow diagram illustrating a data retention programming process according to one or more embodiments. At block 502, the process 500 involves receiving data to be written to a non-volatile solid-state memory. For example, the data may be received in connection with the programming operation requested by, for example, a host device. In certain embodiments, system firmware or hardware is configured to detect a final, or near final, P/E cycle, wherein on the final program operation for each page, the data may be programmed to the solid-state memory using a programming scheme that favors one or more lower voltage states.

At block 504, the process 500 may involve determining whether a relatively long data retention period is expected with respect to the received data. The determination of block 504 may be made in any desirable or practical manner, or may be omitted from the process 500 altogether. For example, a determination that the data is expected to be subject to a long data retention period may be based at least in part on the nature of the data, explicit command or setting indicating that data retention programming mode is to be executed with respect to the data, or any other type of information. In some embodiments, the determination at block 504 may occur prior to block 502. If the determination at block 504 is that data retention programming is not needed, the process 500 may proceed to block 508, where the data may be written to memory according to a default programming/encoding scheme.

At block 504, the process 500 may involve bypassing a data randomizer, or data scrambler, which may be a component of a data path of the data storage device. In certain embodiments, the randomizer is a component of the solid-state memory controller. In certain embodiments, bypassing of the data randomizer does not take place. For example, rather than bypassing the data randomizer, the process 500 may involve applying any data retention weighted pattern to the data path downstream from the data randomizer, such as between the data randomizer and the solid-state memory.

At block 506, the process 500 involves encoding the data using a particular pattern designed to favor lower-voltage programming states. For example, in an SLC programming scheme, the pattern may favor a lower programming voltage state over an alternative higher program voltage state. Furthermore, in MLC programming schemes, one or more than one lower-voltage programming state may be favored according to the data retention pattern. At block 508, the process 500 involves writing/programming the encoded data to non-volatile solid-state memory. By programming more cells into the lower voltage states, the programmed cells may tend to lose less charge due to data retention effects. That is, as retention related effects may generally be seen more predominantly on the higher/highest voltage programmed state(s), using the lower voltage state weighed programming scheme may result in less cells programmed to the higher/highest voltage state(s), and thus fewer cells may undesirably migrate down to the next lower state due to data retention effects. This may result in lower overall raw bit error rate and may improve the data retention in the memory device. With improved physical data retention, a system may be configured for increased endurance while leaving the data retention specification unchanged since data retention and endurance may generally be considered substantially inversely proportional.

Read Disturb Compensation

Certain embodiments disclosed herein provide a data encoding/programming scheme in which cells are programmed unequally among possible programming states (e.g., four states in two bits per cell MLC) in order to minimize the impact of read disturb on raw bit error rate. In certain embodiments, weighted programming to compensate for read disturb effects may be accomplished at least in part by processing the data to be programmed in such a way that the resultant data pattern generated and programmed directly to the solid-state memory favors a larger number of cells in, for example, states 'C' and 'B,' (see FIG. 2), with relatively fewer cells in, 'A,' and even fewer in the 'E' state. In certain embodiments, the highest voltage state has the highest number of cells, the second highest voltage state has the second highest number of cells, the third highest voltage state has the third highest number of states, and the lowest voltage state has the lowest number of cells. In other embodiments, similar to the variations in the data retention programming, the favored or disfavored states may be assigned by subsets.

Such a scheme may result in fewer cells being susceptible to the most common E-to-A state transition (discussed below), and to a lesser extent, the A-to-B transition, that is associated with read disturb and thereby reducing the overall raw bit error rate of the page when compared to programming using a random pattern. In certain embodiments, the randomizer/scrambler may be disabled or bypassed, or its results post-processed, when in the storage device is in a read disturb program mode and utilizing the high voltage favoring programming scheme.

Figure 6:
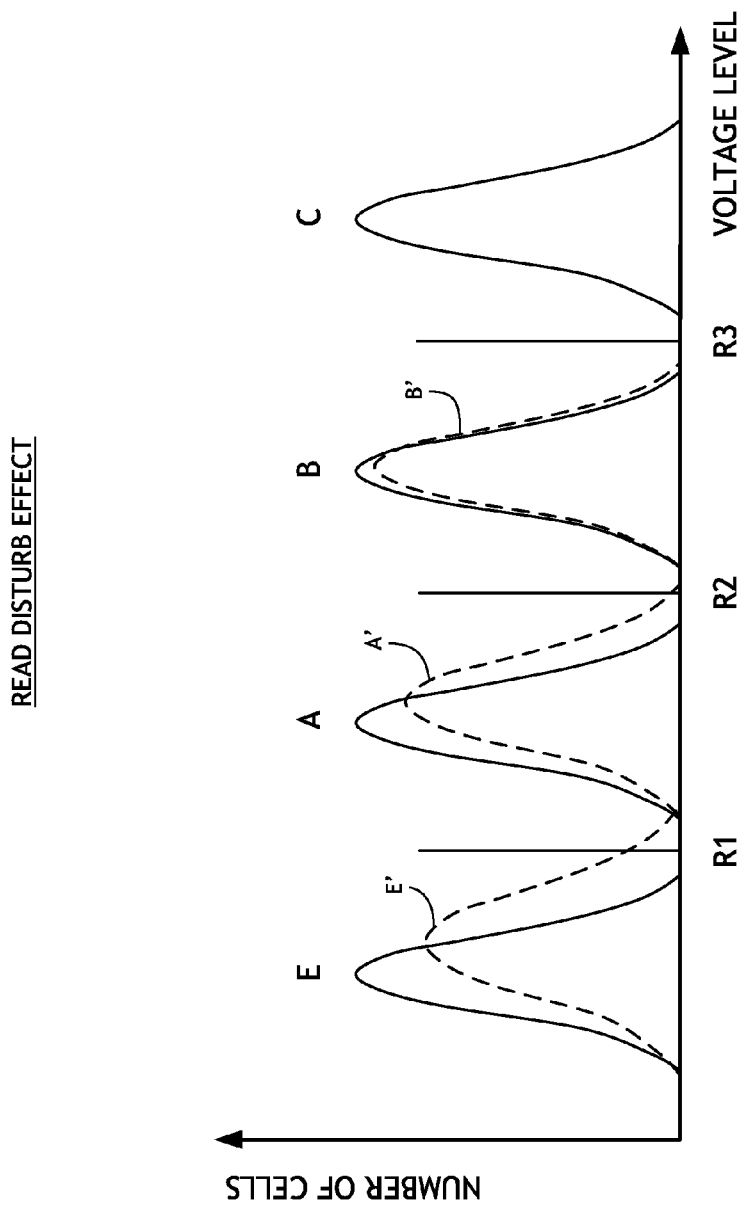
FIG. 6 is a graph showing a probability distribution of cells showing possible read disturb effects according to one or more embodiments.

FIG. 6 is a graph showing a probability distribution of cells showing possible read disturb effects according to one or more embodiments. In certain embodiments, the effect of read disturb may be greater with respect to lower voltage states, and in particular with respect to the lowest voltage state (e.g., the 'E' or 'erased' state). FIG. 6 shows the possible impact of read disturb on the various distributions in an example two bits per cell MLC programming scheme. As shown in FIG. 6, the 'E' state distribution may migrate/widen to the right to the greatest extent. The number of reads that may occur before such effects are evident may vary from system to system, and may be in the hundreds of thousands of reads between intervening erase operations in certain embodiments. Therefore, applications such as read caching or the like where the data is repeatedly read without being overwritten may suffer from read disturb depending on the volume/frequency of reads over a period of time.

Figure 7:
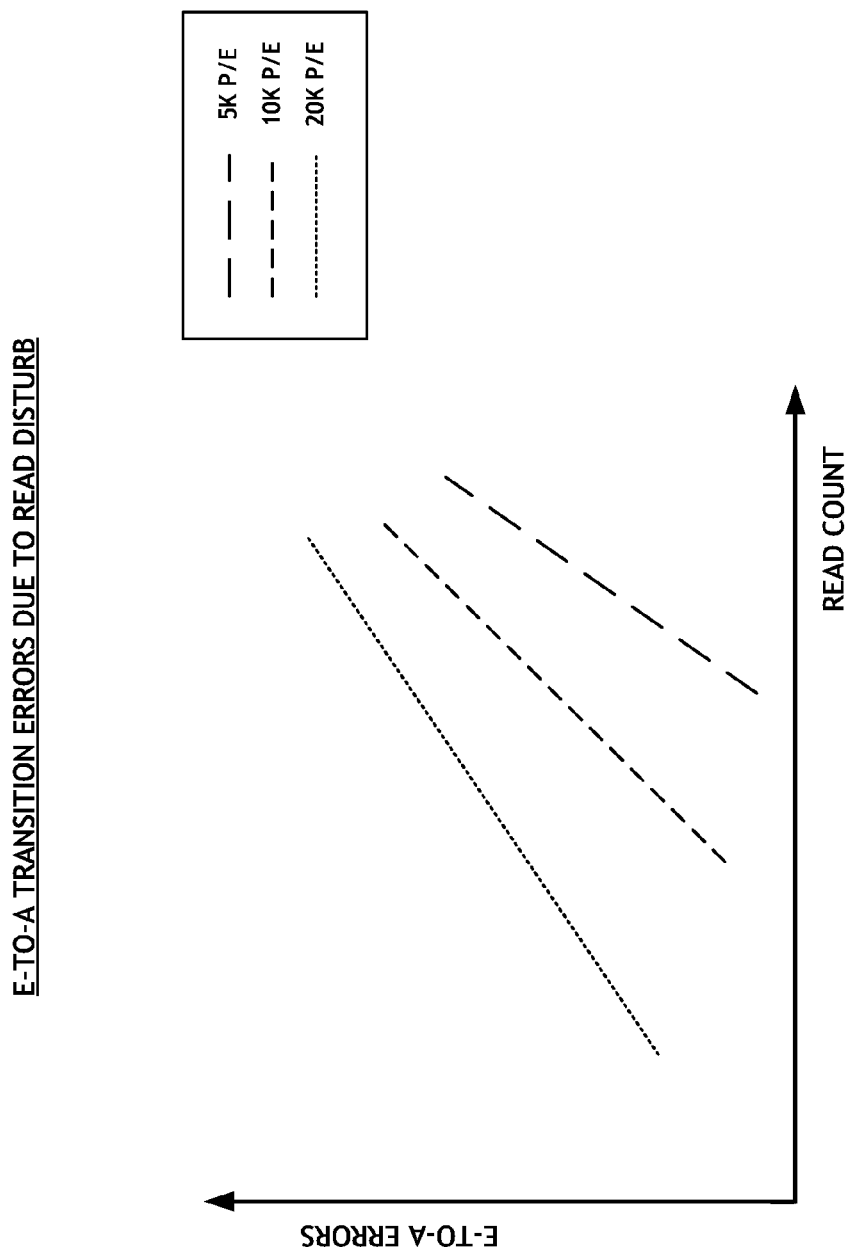
FIG. 7 is a graph showing state-to-state transition errors in a solid-state memory device according to one or more embodiments.

FIG. 7 is a graph showing state-to-state transition errors in a solid-state memory device according to one or more embodiments. FIG. 7 illustrates that E-to-A transitions may be elevated by the read disturb effect from an increasing number of read cycles, and a memory has been subject to more program erase cycles has a steeper rise in such state transitions relative to the number of read cycles.

Thus, certain embodiments disclosed herein at least partially alleviate the effects of read disturb on solid-state memory cells by programming more cells into the higher voltage states (e.g., the 'C; and/or 'B' states), resulting in the cells gaining relatively less charge due to read disturb effects. That is, because read disturb effects can generally be seen more predominantly on the lowest voltage programmed states (e.g., the 'A' state and, to a greater extent, the 'E' state), using the high voltage state weighted pattern, fewer cells may be programmed to the lower/lowest voltage state(s), and thus fewer cells may move up to the next higher voltage state due to read disturb effects. This may result in lower raw bit error rate in solid-state memory devices that are subject to relatively high read utilization.

Any suitable or desirable pattern may be utilized to program more cells into the higher/highest voltage states. Unequal programming of high voltage states as disclosed herein may provide increased margin for read disturb effects. Application of the high voltage level weighted pattern may be accomplished by encoding to-be-programmed data into a data pattern that favors a larger number of cells in one or more higher/highest voltage states. The higher voltage state weighted pattern may result in fewer cells making the most common E-to-A state transition, and possibly to a lesser extent the A-to-B transition, that is associated with read disturb compared to a scheme involving programming of an evenly-distributed random pattern. In certain embodiments, the pre-programming data randomizer/scrambler may be disabled when the storage device is operating in a read disturb compensation programming mode and utilizing the high voltage state weighted programming scheme.

Figure 8:
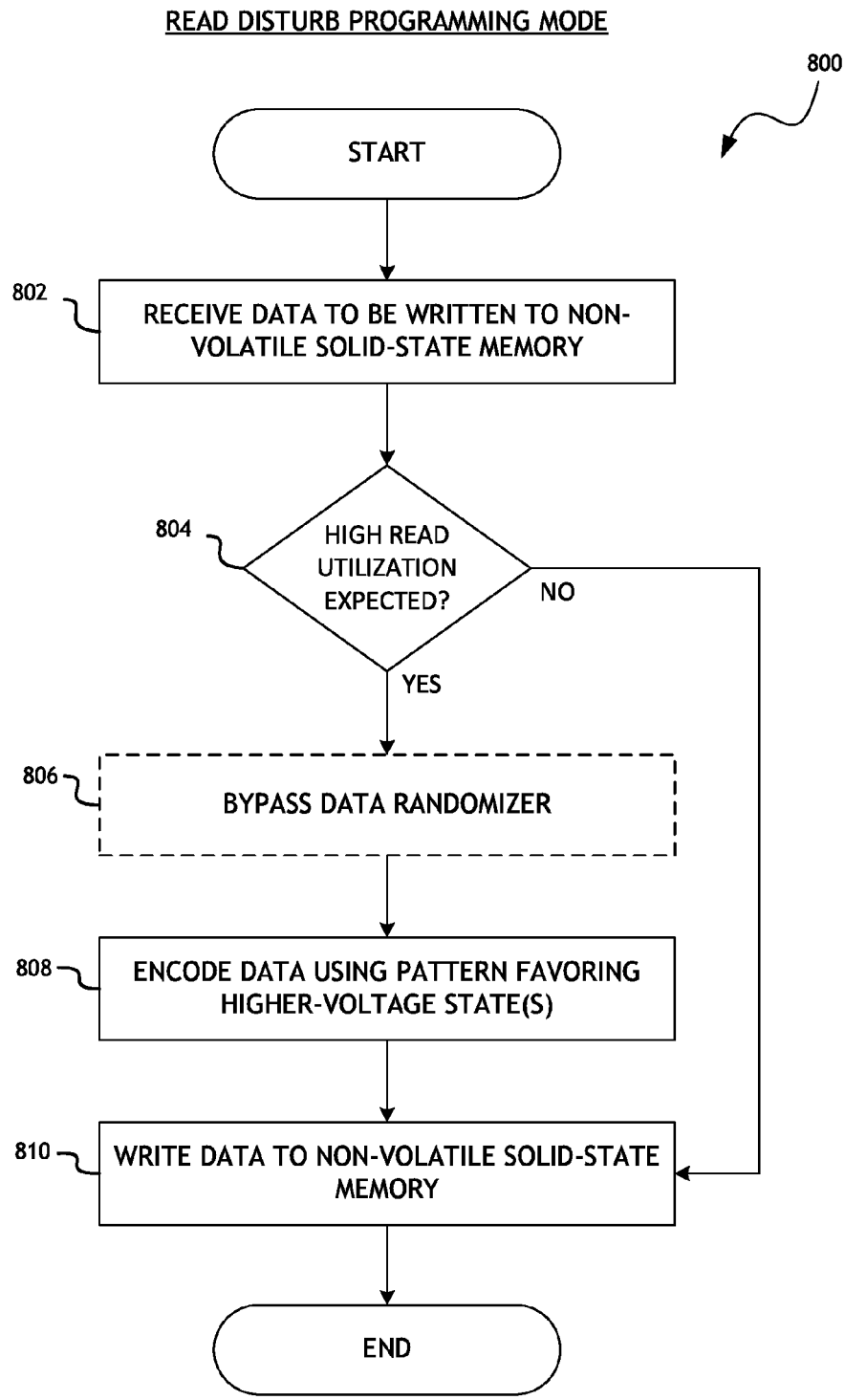
FIG. 8 is a flow diagram illustrating a read disturb programming mode according to one or more embodiments.

FIG. 8 is a flow diagram illustrating a read disturb programming mode according to one or more embodiments. At block 802, the process 800 involves receiving data to be written to non-volatile solid-state memory. For example, the data may be received in connection with a data programming operation provided by a host device or system to, for example, a data storage device. Data received may include data not received from the host, such as metadata related to device operation, or data to be written as part of internal operations such as garbage collection and wear leveling.

At block 804, the process 800 may involve determining whether a relatively high read utilization is expected with respect to the received data. The determination of block 804 may be made in any desirable or practical manner, or may be omitted from the process 800 altogether. For example, a determination that the data is expected to be subject to high read utilization may be based at least in part on a nature of the data, explicit command or setting indicating that read disturb programming mode is to be executed with respect to the data, or any other type of information. In some embodiments, the determination at block 804 may occur prior to block 802.

In certain embodiments, the determination at block 804 may be made in order to ensure that read disturb compensation programming is not used indiscriminately. For example, the high voltage level weighted programming scheme may only be applied under certain conditions in order to prevent the cells from wearing out unequally, which may cause an increase in program disturb losses. The determination at block 804 may be based on any desirable or suitable trigger or condition indicating that read disturb compensation may be desirable. In certain embodiments, the system firmware or hardware may be configured to detect the P/E cycle preceding high-read utilization of a block, wherein on the last program operation before the high-read utilization the data may be programmed to the memory using a programming scheme that favors higher voltage state(s).

In certain embodiments, a command to enable and/or disable the use of the high voltage state weighted programming scheme may be part of the host interface command protocol associated with the memory device. When the host is aware that read disturb compensation may be needed, the host may proactively trigger in the data storage device the sequence to program the data using the high voltage state weighted programming scheme (e.g., read cache misses that produce program operations to the memory).

In hybrid storage drive embodiments, where a portion of a non-volatile solid-state storage device is dedicated to read cache functionality, the high voltage state weighted algorithm may substantially always be used to write data to the solid-state storage device. In certain embodiments, a special application read cache device could be built wherein the high voltage state weighted algorithm may be substantially always used to write to the device. In certain embodiments, the high voltage state weighted programming scheme is used in single instances in anticipation of the data storage device going into a high read utilization mode. This same principle can be generally applied to other tiered storage systems and applications, where the solid-state memory is being used as a fast read cache tier.

If the determination at decision block 804 is 'NO,' the process 800 proceeds to block 810 where the data may be written to non-volatile solid-state memory according to normal drive operation. Alternatively, if the determination at block 804 is 'YES,' i.e., the data is expected to be subject to a high read utilization, the process 800 may proceed to one or more of blocks 806 and 808. At block 806, the process 800 may involve bypassing a data randomizer/scrambler, which may be configured otherwise to substantially randomize or even out the data across one or more programming states prior to programming the data to non-volatile storage. In certain embodiments, the data randomizer is not bypassed. For example, weighted patterning according to one or more embodiments may be applied downstream from the data randomizer, such that the randomize data may be further patterned to favor one or more voltage states prior to programming.

At block 810, the data is programmed to the non-volatile solid-state memory. For example, where the data was encoded according to a weighted pattern at block 808 favoring higher-voltage state(s), such encoded data may be written at block 810. By programming more cells into the higher/highest voltage state(s), the cells may tend to gain less charge due to read disturb effects.

Weighted Pattern Encoding Processes

Figure 9:
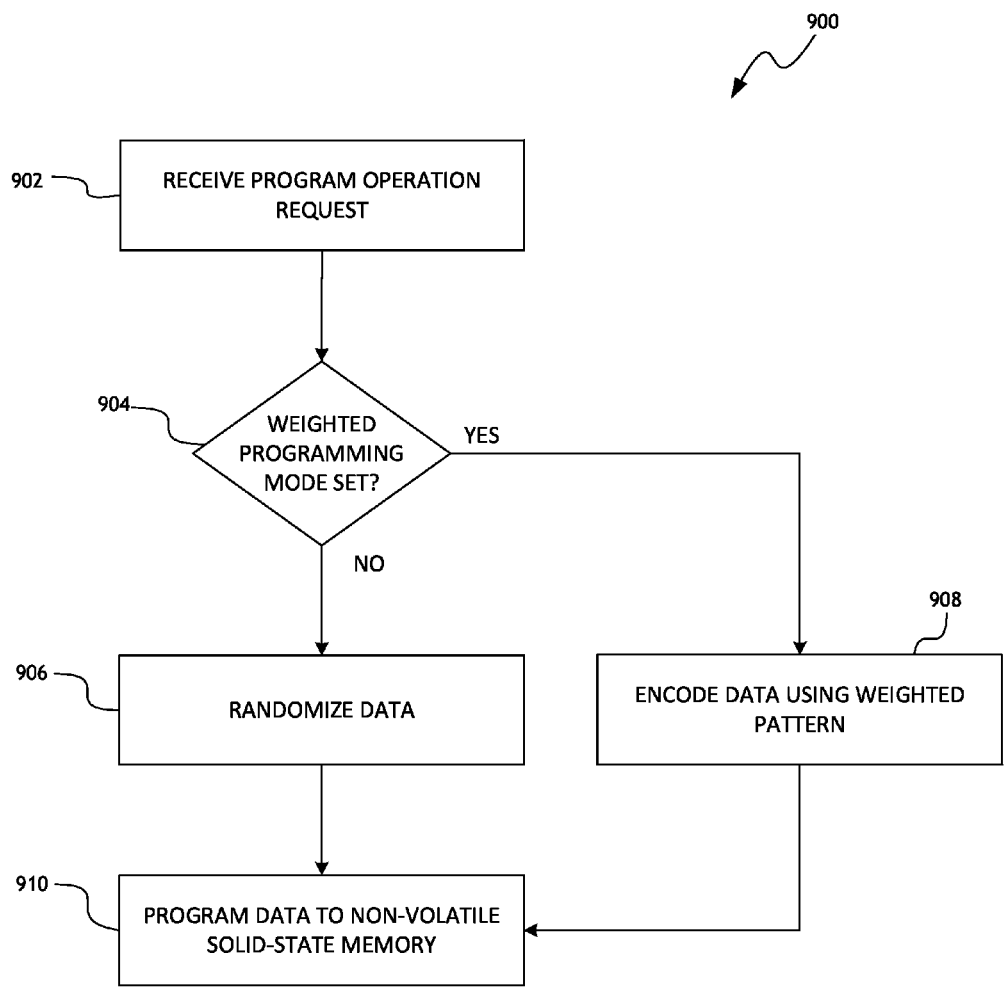
FIG. 9 is a flow diagram illustrating a programming process implementing a weighted pattern according to one or more embodiments.

FIG. 9 is a flow diagram illustrating a programming process implementing a weighted pattern according to one or more embodiments. At block 902, the process 900 involves receiving a programming operation. For example, the programming operation request may be received from a host device or system communicatively coupled to a data storage device. At block 904, the process 900 involves determining whether a weighted programming mode is set, such as a retention related effects compensation or read disturb compensation programming mode, as are described in greater detail above herein.

The determination at block 904 may be based on any suitable or desirable information. For example, the storage device may utilize a flag that, when set, indicates that a weighted programming mode is set. The flag or indicator may indicate a value with respect to whether a particular weighted programming mode is set, or may indicate which among a group of possible weighted programming modes (e.g., data retention compensation and read disturb compensation modes) is set, if any. In certain embodiments, weighted programming may be implemented in anticipation of solid-state memory device power-down or flushing. For example, certain parameters may indicate that a data retention mode, or read disturb mode, is a next operational stage. In certain embodiments, a data storage device may be in a tier for relatively cold storage for an extended period of time, such that the weighted programming mode for retention related effects compensation is set for the extended period.

In certain embodiments, the host system/device may have direct control over the mode of operation. In certain embodiments, the type of data being written may dictate the programming mode. For example, an operating system, or other critical data, such as system table or the like, may be written in retention related effects compensation mode. The storage device may be configured to recognize certain types of data as triggering certain programming mode(s).

If the retention related effects compensation or read disturb compensation mode(s) are not set, the process 900 may proceed to block 906, where data associated with the program operation request may be randomized according to normal operation of the data storage device, after which such data may be programmed to non-volatile solid-state memory of the data storage device, for example. If, however, the determination at block 904 is that the retention related effects compensation or read disturb compensation mode(s) are set, the process 900 may proceed to block 908, where the data associated with the program operation request may be encoded according to a weighted pattern, as described herein. For example, the weighted pattern may favor one or more higher-voltage programming states and/or lower-voltage programming states.

Once the data associated with program operation has been encoded at block 908, the process 900 may proceed to block 910, where such encoded data may be programmed to the non-volatile solid-state memory of the data storage device. In certain embodiments, some data stored in the non-volatile solid-state memory may be encoded using the weighted pattern, while other of the data stored in the memory may be randomized according to a default programming scheme. In such implementations, it may be necessary to maintain system data to track the encoding state of the cells/blocks of the memory to allow for proper decoding of the data. Weighted pattern encoding may be implemented on a block-by-block, page-by-page, or other basis.

Figure 10:
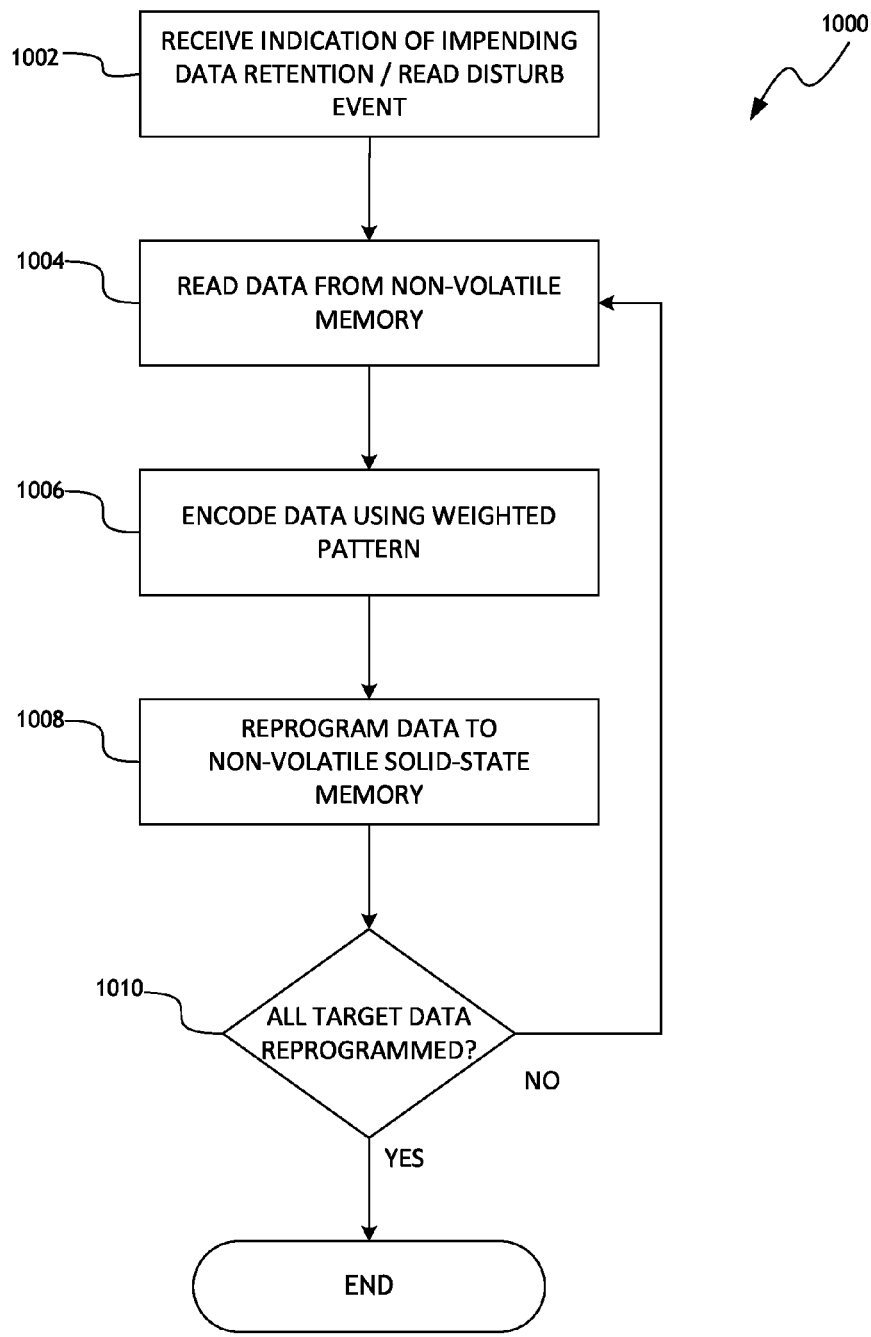
FIG. 10 is a flow diagram illustrating a data reprogramming process according to one or more embodiments.

While FIG. 9 illustrates the general operation of mode setting, in some embodiments multiple modes may be in concurrent use within a data storage device. For example, a portion of the memory may be set to be programmed in a randomized data mode while another portion may be set to be programmed in one of the aforementioned special mode(s). The assignment can thus be localized and in some embodiments can be dynamically changed so that an area of memory being programmed in one mode may be switched to be programmed in another mode. For example, as discussed above, memory blocks having higher P/E counts are more susceptible to certain negative effects and thus mode switching may be contingent upon P/E count thresholds by blocks. By extension, as illustrated in FIG. 10 below, in certain embodiments, data programmed in one mode may be reprogrammed in another mode. In addition, a number of sub-modes having different weighted distributions may be used, and individual sub-modes may be suitably applied according to different applications. For example, several data retention programming sub-modes may each have distributions that favor lower/lowest voltage states differently.

FIG. 10 is a flow diagram illustrating a data reprogramming process according to one or more embodiments. At block 1002, the process 1000 involves receiving or identifying an indication of impending data retention and/or read disturb condition(s) and/or event(s); such an indication may make it desirable to reprogram previously-stored data in non-volatile solid-state memory according to a weighted pattern that is designed to compensate for retention related and/or read disturb effects.

A command to direct the memory device to prepare all, or a portion of, data on the device for retention related effects and/or read disturb compensation could be implemented in the host interface. This command may be issued by the host in order to prepare the data on the device for a data retention or read disturb event or period. The host command may comprise, for example, an augmented flush or shutdown command. The data storage device may read all, or a portion of, the valid data on the solid-state memory and re-write the data using a weighted programming scheme, as described herein. Once all data that is to be reprogrammed has been rewritten, a completion status may be returned to the host indicating that the extended data retention event, read disturb event, or other event or condition, can safely begin. In some embodiments, the rewrite process may be initiated by the storage device and not triggered by the host.

At block 1004, the process 1000 involves reading data stored in volatile or non-volatile memory, such as in a solid-state non-volatile memory module, such that such data may be reprogrammed according to a weighted pattern in order to compensate for retention related and/or read disturb effects. The process 1000 may therefore involve propagating all, or a portion of, data stored in solid-state memory that has been programmed based on randomizer-generated data pattern, to a high or low voltage state weighted data pattern. In certain embodiments, the host has knowledge of the time necessary to implement the desired reprogramming, and may therefore plan for execution thereof accordingly.

At block 1006, the process 1000 involves encoding the read-out data using a weighted pattern designed to compensate for one or more of read disturb and retention related effects. At block 1008, the process 1000 involves writing the encoded data to the memory module from which is read, or to a separate memory module. At block 1010 is determined whether all of the target data that is desired to be reprogrammed has been reprogrammed. If not, the process 1000 may proceed back to block 1004, where additional data may be read and reprogrammed according to blocks 1004-1008.

ADDITIONAL EMBODIMENTS

Those skilled in the art will appreciate that in some embodiments, other types of solid-state weighted programming systems can be implemented while remaining within the scope of the present disclosure. In addition, the actual steps taken in the processes discussed herein may differ from those described or shown in the figures. Depending on the embodiment, certain of the steps described above may be removed, and/or others may be added.

While certain embodiments have been described, these embodiments have been presented by way of example only, and are not intended to limit the scope of protection. Indeed, the novel methods and systems described herein may be embodied in a variety of other forms. Furthermore, various omissions, substitutions and changes in the form of the methods and systems described herein may be made. The accompanying claims and their equivalents are intended to cover such forms or modifications as would fall within the scope and spirit of the protection. For example, the various components illustrated in the figures may be implemented as software and/or firmware on a processor, application-specific integrated circuit (ASIC), field-programmable gate array (FPGA), or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

All of the processes described above may be embodied in, and fully automated via, software code modules executed by one or more general purpose or special purpose computers or processors. The code modules may be stored on any type of computer-readable medium or other computer storage device or collection of storage devices. Some or all of the methods may alternatively be embodied in specialized computer hardware.

What is claimed is:

1. A data storage device comprising:
   a solid-state non-volatile memory including a plurality of memory cells; and
   a controller configured to improve data retention of at least a portion of the solid-state non-volatile memory at least in part by:
   receiving data to be written to the solid-state non-volatile memory;
   when a data retention programming mode is set:
   encoding the data using a programming pattern that favors a first programming state over a second programming state, the first programming state being associated with a lower voltage level than the second programming state; and
   writing the encoded data to the solid-state non-volatile memory.

2. The data storage device of claim 1, further comprising a data randomizer, wherein the controller is further configured to bypass the data randomizer when the data retention programming mode is set.

3. The data storage device of claim 1, wherein the controller is further configured to receive a request to set the data retention programming mode from a host device communicatively coupled to the data storage device over an interface.

4. The data storage device of claim 1, wherein the controller is further configured to:
   read at least a portion of data stored in the solid-state non-volatile memory;
   encode the at least a portion of data using the programming pattern; and
   rewrite the encoded at least a portion of data back to the solid-state non-volatile memory.

5. The data storage device of claim 1, wherein the controller is further configured to program the plurality of memory cells according to a multi-level cell (MLC) programming scheme, wherein the second programming state corresponds to a highest programming state of the MLC programming scheme.

6. The data storage device of claim 1, wherein the programming pattern further favors a third programming state over the first programming state, the third programming state being associated with a lower voltage level than the first programming state.

7. The data storage device of claim 1, wherein the controller is further configured to set the data retention programming mode in response to a flush command.

8. The data storage device of claim 1, wherein the controller is further configured to determine that the data retention programming mode is set when a power-down process is initiated.

9. The data storage device of claim 1, wherein the controller is further configured to set the data retention programming mode based on a type of the data.

10. The data storage device of claim 1, wherein the controller is further configured to determine whether the data retention programming mode is set at least in part by determining whether the solid-state non-volatile memory has experienced more than a threshold number of write cycles.

11. The data storage device of claim 1, wherein the controller is further configured to determine whether the data retention programming mode is set at least in part by determining whether a threshold number of blocks of the solid-state non-volatile memory are available in a free block pool of the solid-state non-volatile memory.

12. A method of programming data in a solid-state non-volatile memory, the method comprising:
    receiving data to be written to a solid-state non-volatile memory;
    determining whether a data retention programming mode associated with the solid-state non-volatile memory is set; and
    when the data retention programming mode is set:
        encoding the data using a programming pattern that favors a first programming state over a second programming state, the first programming state being associated with a lower programming voltage level than the second programming state; and
        writing the encoded data to the solid-state non-volatile memory.

13. The method of claim 12, further comprising bypassing a data randomizer when the data retention programming mode is set.

14. The method of claim 12, further comprising receiving a request to set the data retention programming mode from a host device communicatively coupled to a data storage device over an interface, the data storage device comprising the solid-state non-volatile memory.

15. The method of claim 12, further comprising:
    reading at least a portion of data stored in the solid-state non-volatile memory;
    encoding the at least a portion of data using the programming pattern; and
    writing the encoded at least a portion of data back to the solid-state non-volatile memory.

16. The method of claim 12, further comprising determining whether the data retention programming mode is set at least in part by determining whether the solid-state non-volatile memory has experienced more than a threshold number of write cycles.

17. The method of claim 12, further comprising determining whether the data retention programming mode is set at least in part by determining whether a threshold number of blocks of the solid-state non-volatile memory are available in a free block pool of the solid-state non-volatile memory.

18. The method of claim 12, wherein the programming pattern further favors a third programming state over the first programming state, the third programming state being associated with a lower voltage level than the first programming state.

19. A data storage device comprising:
    a solid-state non-volatile memory including a plurality of memory cells; and
    a controller configured to reduce a read disturb effect of at least a portion of the solid-state non-volatile memory at least in part by:
        receiving data to be written to the solid-state non-volatile memory;
        when a read disturb programming mode is set:
            encoding the data using a programming pattern that favors a first programming state over a second programming state, the first programming state being associated with a higher voltage level than the second programming state; and
            writing the encoded data to the solid-state non-volatile memory.

20. The data storage device of claim 19, further comprising a data randomizer, wherein the controller is further configured to bypass the data randomizer when the read disturb programming mode is set.

21. The data storage device of claim 19, wherein the controller is further configured to receive a request to set the read disturb programming mode from a host device communicatively coupled to the data storage device over an interface.

22. The data storage device of claim 19, wherein the controller is further configured to:
    read at least a portion of data stored in the solid-state non-volatile memory;
    encode the at least a portion of data using the programming pattern; and
    rewrite the encoded at least a portion of data back to the solid-state non-volatile memory.

23. The data storage device of claim 19, wherein the controller is further configured to program the plurality of memory cells according to a multi-level cell (MLC) programming scheme, wherein the second programming state corresponds to a lowest programming state of the MLC programming scheme.

24. The data storage device of claim 19, wherein the programming pattern further favors a third programming state over the first programming state, the third programming state being associated with a higher voltage level than the first programming state.

25. The data storage device of claim 19, wherein the controller is further configured to set the read disturb programming mode based on a type of the data.

26. The data storage device of claim 19, wherein the controller is further configured to determine whether the read disturb programming mode is set at least in part by determining whether the solid-state non-volatile memory has experienced more than a threshold number of read or write cycles.

* * * * *